United States Patent
Nehrig et al.

(10) Patent No.: US 7,855,595 B2
(45) Date of Patent: Dec. 21, 2010

(54) HIGH DYNAMIC RANGE ASK DEMODULATOR FOR USE IN AN RFID TRANSPONDER

(75) Inventors: Oliver Nehrig, Kirchdorf (DE); Carlo Peschke, Freising Bayern (DE); Ernst Muellner, Munich Bayern (DE); Adolf Baumann, Haag an der Amper (DE); Jens Graul, Freising Bayern (DE)

(73) Assignee: Texas Instruments Deutschland GmbH, Freising (DE)

( * ) Notice: Subject to any disclaimer, the term of this patent is extended or adjusted under 35 U.S.C. 154(b) by 219 days.

(21) Appl. No.: 12/182,612

(22) Filed: Jul. 30, 2008

(65) Prior Publication Data

US 2009/0189688 A1    Jul. 30, 2009

Related U.S. Application Data

(60) Provisional application No. 61/016,757, filed on Dec. 26, 2007.

(30) Foreign Application Priority Data

Aug. 2, 2007    (DE) .................. 10 2007 036 207

(51) Int. Cl.
    *H03K 9/02* (2006.01)
(52) U.S. Cl. .................................. 329/311; 375/353
(58) Field of Classification Search ............. 329/311, 329/347; 375/286–294, 353
    See application file for complete search history.

(56) References Cited

U.S. PATENT DOCUMENTS

| 6,089,453 A * | 7/2000 | Kayser et al. ............... 235/383 |
| 2007/0127560 A1 | 6/2007 | Kang et al. |
| 2008/0224766 A1 * | 9/2008 | Yamazaki et al. ........... 329/347 |

FOREIGN PATENT DOCUMENTS

| DE | 69601588 T2 | 10/1999 |
| DE | 2153827 | 11/2008 |

OTHER PUBLICATIONS

Hiroyuki Nakamoto et al, "A Passive UHF RI Identification CMOS Tag IC Using Ferroelectric RAM in 0.35-um Technology", Jan. 1, 2007, pp. 101-110, vol. 42. No. 1, IEEE Journal of Solid-State Circuits.

* cited by examiner

*Primary Examiner*—David Mis
(74) *Attorney, Agent, or Firm*—William B. Kempler; Wade J. Brady, III; Frederick J. Telecky, Jr.

(57) ABSTRACT

An ASK demodulator for use in an RFID transponder having a limiter circuit associated with the antenna circuit and converting the ASK antenna field strength modulation into an ASK limiter current modulation by limiting the antenna voltage to a fixed value and thereby causing the limiter current to be substantially proportional to the ASK antenna field strength, and a current discriminator circuit that discriminates the ASK limiter current modulation. By converting the field strength modulation into a proportional limiter current and discriminating that limiter current, a linear relationship and a stable demodulator sensitivity are achieved. The current discrimination can be made accurately under low-voltage conditions.

6 Claims, 3 Drawing Sheets

HIGH DYNAMIC RANGE ASK DEMODULATOR FOR USE IN AN RFID TRANSPONDER

FIELD OF THE INVENTION

The present invention relates to an ASK demodulator for use in an RFID transponder.

BACKGROUND OF THE INVENTION

The analog front end of an RFID transponder includes a resonant LC antenna circuit. In high frequency RFID transponders the resonant frequency is typically 13 MHz. The antenna captures the modulated RF field from an interrogator (ASK downlink modulation) giving rise to a fairly high antenna voltage with voltage swings in the range of 8V. An antenna voltage in the range of 8V allows a straight forward envelope detection for demodulation with a conventional CMOS circuit used in the RFID transponder.

However, advanced CMOS technologies allow only small drain-source and gate voltages. A voltage swing in a range of 8V is too high for integrated CMOS circuits implemented in an advanced CMOS technology, especially when a low cost process is used which does not support high voltage transistors or high precision capacitors for use in a resonant circuit. The antenna voltage needs to be limited by some voltage limiting circuit to comply with the specifications of the CMOS circuit. When a voltage limitation to a maximum of 3.6V is needed, the minimum needed supply voltage limits the antenna voltage down to 1.6V plus a (rectifier) diode voltage of 0.8V i.e. 2.4V. Taking into account inevitable CMOS process variations, the antenna voltage must be limited so as not to exceed a voltage range of 2.4V to 3.6V. Accordingly, the voltage swing from an ASK downlink modulation will be severely clamped, and a direct envelope demodulation will not work any more.

However, the ASK information is present in the limiter current. A possible approach to demodulation is to detect the gate voltage of the limiter transistors in the voltage limiting circuit since it also contains the modulation information. But the gate voltage of the limiter transistors is a quadratic function of the RF field and has to be linearized to ensure a defined sensitivity.

SUMMARY OF THE DISCLOSURE

The present invention takes a different approach. The inventive idea is to demodulate the ASK information contained in the limiter current with a current discriminator circuit that discriminates the ASK limiter current modulation. Preferably, the current discriminator has two current mirrors that both mirror the limiter current but have different PMOS and NMOS ratios.

Specifically, the present invention provides an ASK demodulator for use in an RFID transponder, comprising a limiter circuit associated with the antenna circuit and converting the ASK antenna field strength modulation into an ASK limiter current modulation by limiting the antenna voltage to a fixed value and thereby causing the limiter current to be substantially proportional to the ASK antenna field strength, and a current discriminator circuit that discriminates the ASK limiter current modulation. By converting the field strength modulation into a proportional limiter current and discriminating that limiter current—or a copy of that current—, a linear relationship and a stable demodulator sensitivity are achieved. The current discrimination can be made accurately under low-voltage conditions.

One aspect of the current discriminator can be easily implemented with the following components:
a first current mirror that mirrors the ASK limiter current into a first pair of series-connected complementary MOS transistors,
a second current mirror that mirrors the ASK limiter current into a second pair of series-connected complementary MOS transistors,
and a latch circuit with a set input coupled to the interconnection node of the first pair of complementary MOS transistors and a reset input coupled to the interconnection node of the second pair of complementary MOS transistors. With this configuration, the output of the latch circuit directly provides the demodulation signal as a serial stream of detected "0" and "1" bit values.

Further advantages and features will ensue from the following description of a preferred embodiment with reference to the appending drawings. In the drawings:

DETAILED DESCRIPTION

Figure 1:
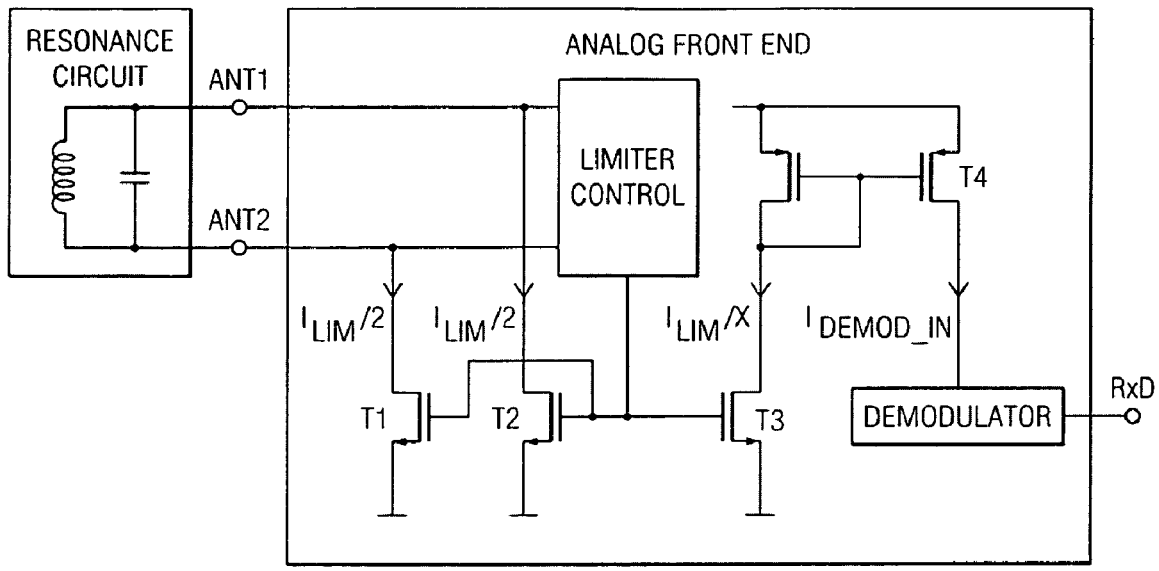
FIG. 1 is a block diagram of a transponder with a voltage limiter circuit and an ASK demodulator.

With reference first to FIG. 1, a transponder has an external LC resonance circuit and an analog front end with input terminals Ant1 and Ant2 connected to the LC resonance circuit. Each of the input terminals Ant1 and Ant2 has an associated limiting transistor T1, T2 the gates of which are interconnected and driven by a limiter control block which is also connected to both input terminals Ant1 and Ant2. Each of the transistors T1 and T2 draws half of the limiter current, $I_{LIM}/2$. A transistor T3 mirrors the limiter current $I_{LIM}/2$ to $I_{LIM}/x$ and a further transistor T4 mirrors the current $I_{LIM}/x$ to $I_{DEMOD\_IN}$, which is the input current $I_{IN}$ to the ASK demodulator circuit of FIG. 2. The output signal RxD of the ASK demodulator corresponds to the output signal $V_{OUT}$ in FIG. 2.

Figure 2:
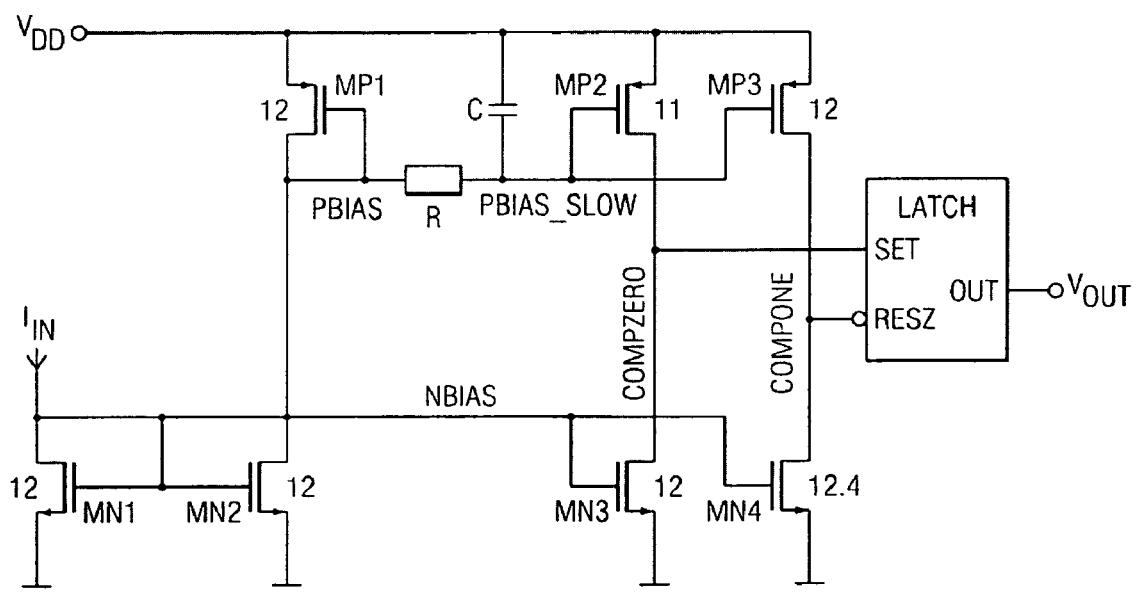
FIG. 2 is a circuit diagram of the ASK demodulator.

The ASK demodulator in FIG. 2 receives as its input $I_{IN}$ the copied limiter current $I_{DEMOD\_IN}$ from the voltage limiter circuit in FIG. 1. The input stage of the demodulator is a diode-connected NMOS transistor NM1 that receives the copy of the limiter current $I_{IN}$ on its drain and has its source connected to ground. The current $I_{IN}$ is mirrored by a second NMOS transistor MN2 at a ratio of 1:1. Transistor MN2 is connected in series with a first PMOS transistor MP1 which is diode-connected between the supply terminal $V_{DD}$ and the drain of transistor MN2. The interconnected drains of transistors MN2 and MP1 provide a bias potential pbias. The limiter current $I_{IN}$ is also mirrored by a third NMOS transistor MN3 which has its gate at the common bias level nbias from transistors MN1 and MN2, and is connected in series with a second PMOS transistor MP2 so that MP2 and MN3 have a common drain voltage compZERO. Transistor MP2 has its gate coupled to the drain of transistor MN2 and the gate of transistor MP1 through an RC lowpass filter that provides bias potential pbias_slow, and thus mirrors the current through transistors MN2 and MP1 with a delay that is a multiple of the bit width of the signal to be demodulated, ensuring that the current through the PMOS transistors is nearly like a DC current. In parallel to transistor pair MP2 and MN3, a further pair of complementary transistors MP3 and MN4 mirror the same currents and provide a common drain voltage compONE on their interconnected drains.

In the transistor pair MP2, MN3 of the first current mirror branch, the NMOS ratio is greater than the PMOS ratio, the relation between the two ratios being e.g. 12:11 in a specific implementation. In the transistor pair MP3, MN4 of the second current mirror branch, the NMOS ratio is only slightly greater than the PMOS ratio, e.g. 12.4:12 in a specific implementation. The relation NMOS ratio to PMOS ratio (e.g. 12:11) is greater in the first current mirror branch than in the second current mirror branch (e.g. 12.4:12). Due to the different transistor ratios between the two current mirror branches, the corresponding common drain voltages compZERO and compONE will be different.

A latch circuit LATCH has a set input connected to the interconnected drains of the first transistor pair MP2, MN3 at the common drain voltage compZERO and a reset input connected to the interconnected drains of the second transistor pair MP3, MN4 at the common drain voltage compONE. The output of the latch circuit LATCH directly provides an output signal $V_{OUT}$ as the demodulated signal consisting of successive ONEs and ZEROs.

Figure 3:
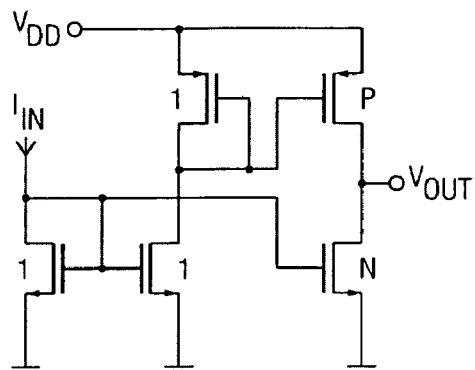
FIG. 3 is a circuit diagram of a basic current discriminator used in the demodulator of FIG. 2.
Figure 4:
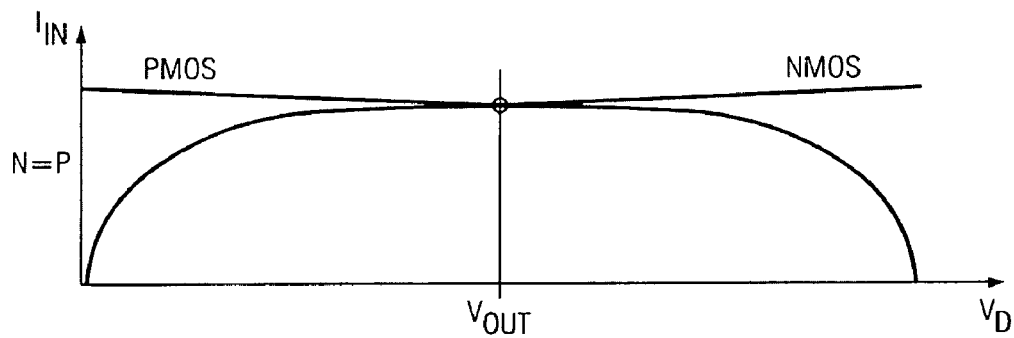
FIG. 4 is a signal diagram illustrating the underlying principles of current discrimination.
Figure 4:
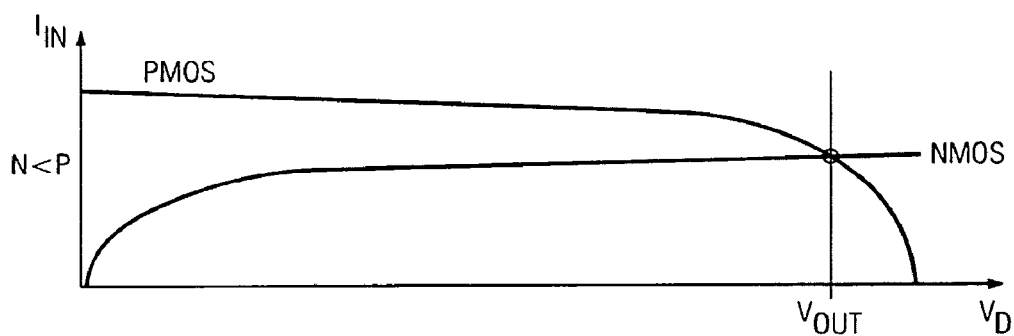
Figure 4:
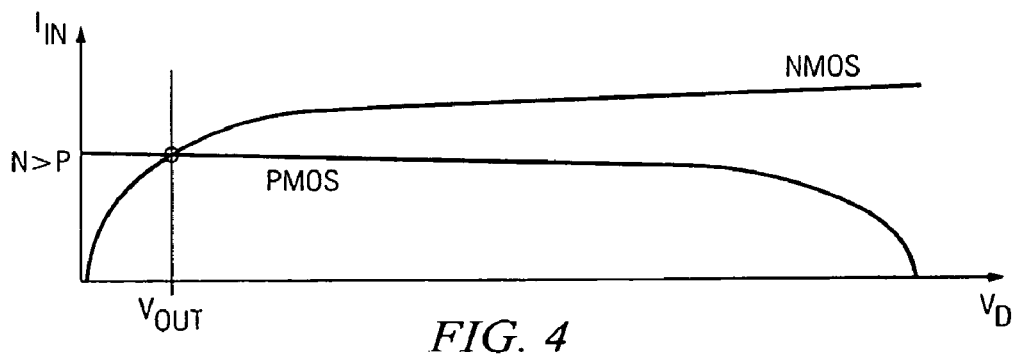

With reference now to FIG. 3, the main underlying idea is a PMOS and a NMOS current mirror with a common current, connected together. The common drain voltage then is strongly dependent on the PMOS and NMOS transistor ratios. The PMOS ratio is 1:P and the NMOS ratio 1:N. The output voltage depending on the transistors ratios is shown in the graphs of FIG. 4.

Figure 5:
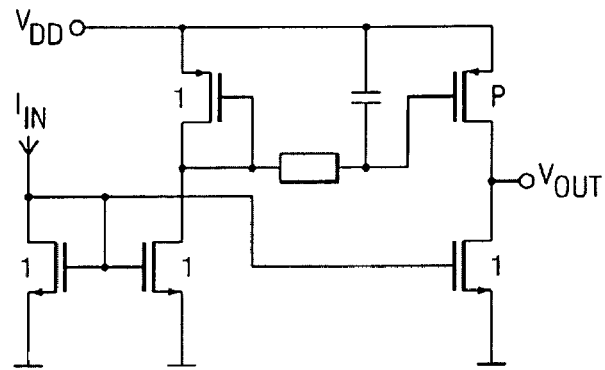
FIG. 5 is a slightly modified circuit diagram of the basic current discriminator.

Now setting N=1 and P<1. The PMOS mirror should be very slow like shown in the slightly modified diagram of FIG. 5. It should be understood that FIG. 5 is a partial circuit of the demodulator intended to explain the principles of the invention. The behaviour for a transient decreasing input current looks like the graph of FIG. 6.

Figure 6:
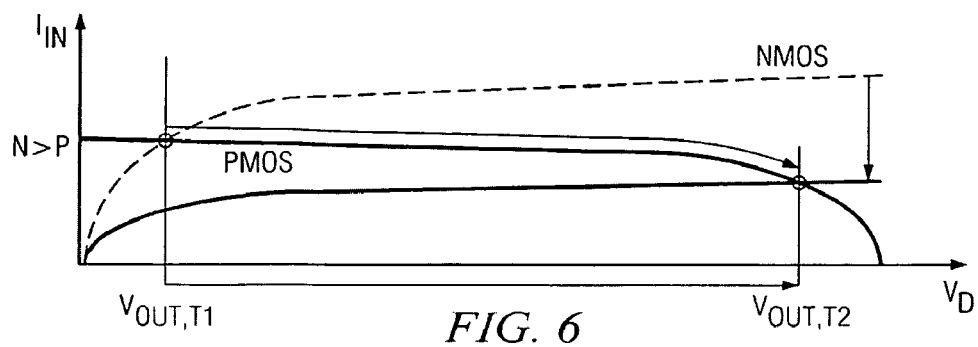
FIG. 6 and FIG. 7 are signal diagrams further illustrating the underlying principles of current discrimination.
Figure 7:
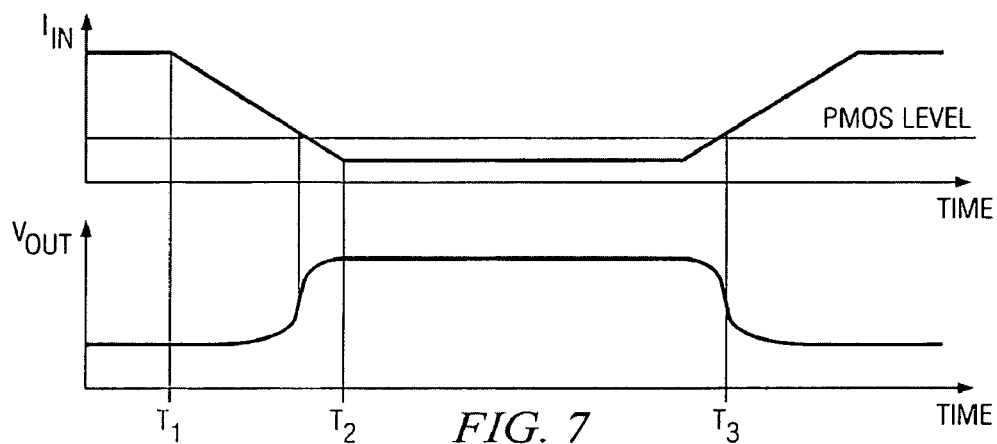

The transient behaviour in the graph of FIG. 7 shows the functionality of the demodulator principle. FIGS. 6 and 7 should be considered in relation to the partial circuit in FIG. 5. When the input current decreases by more than the same ratio as the PMOS transistor ratio, the output voltage changes from '0' to '1'. Now, however, the demodulator will be sensitive to noise in the low current region. Therefore, a second mirror pair with an NMOS ratio slightly above 1 has been inserted, as shown in FIG. 2. With the latch circuit at both outputs, the functionality of a current demodulator now is as illustrated in FIG. 8.

Figure 8:
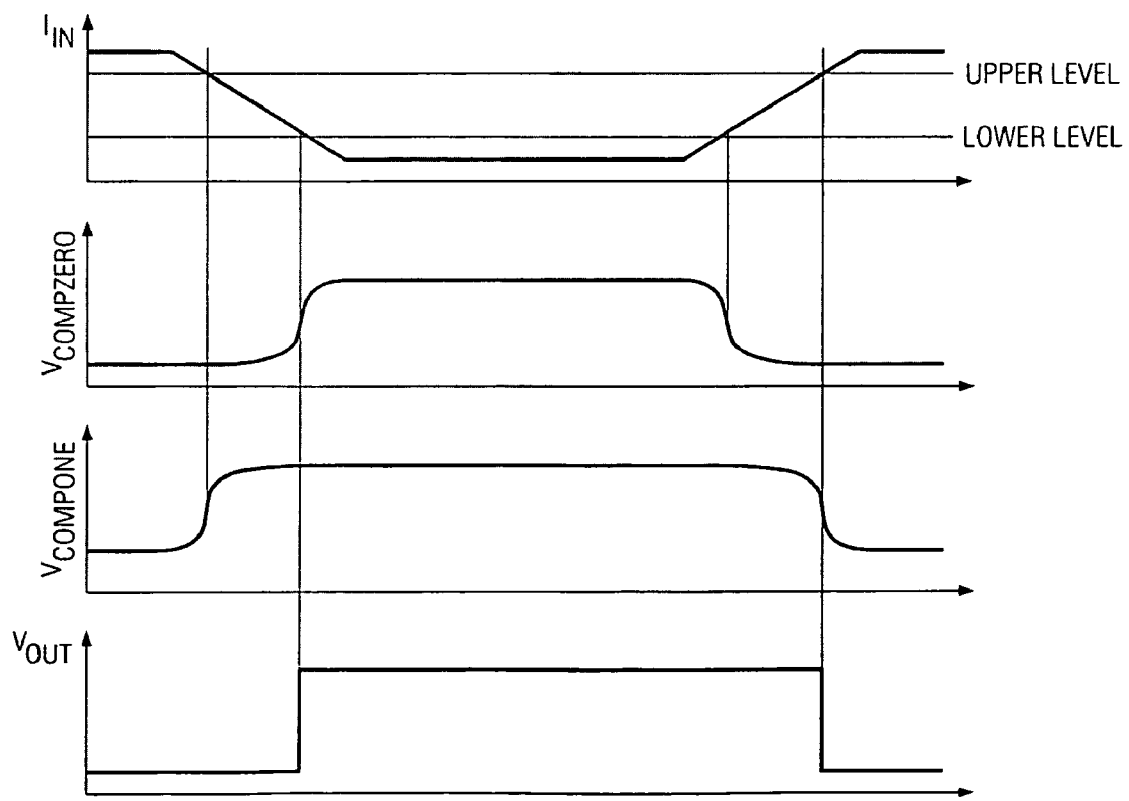
FIG. 8 is a signal diagram illustrating the operation of the demodulator in FIG. 2.

With reference to FIG. 8, due to the different transistor ratios in the two current mirror branches, the output voltages $V_{CompZERO}$ and $V_{CompONE}$ have different threshold values. As long as both output voltages $V_{CompZERO}$ and $V_{CompONE}$ are low, the latch is in a RESET state. When $V_{CompONE}$ goes high, the latch reset is released and the latch is prepared for switching. However, switching of the latch only occurs when output voltages $V_{CompZERO}$ goes high, as seen in FIG. 8. A similar hysteresis (similar to a Schmitt trigger) is observed in FIG. 8 for the switching of the latch to the opposite condition.

The input current in the analog front end is the mirrored limiter current, and the correlation between H-field and limiter current is given:

$$I_{LIM} = H_{(d)} \cdot K - I_0$$

With:

$I_{LIM}$: Limiter current
$H_{(d)}$: Electromagnetic Field strength at the Tag's antenna (at distance d from a readers antenna)
K: constant factor, depends on antenna parameter
$I_0$: Current that is needed in the resonant circuit, to build up the supply voltage
 1. (Includes also the IC's current consumption)

For $H_{(d)} * K > I_0$, there is a linear correlation given between limiter current and field strength.

The ASK modulation index m normally is given by:

$$m = \frac{I_{unmod} - I_{mod}}{I_{unmod} + I_{mod}}$$

This means a constant ratio between the modulated ($I_{mod}$) and unmodulated limiter current ($I_{unmod}$).

$$I_{mod} = I_{unmod} \cdot \frac{1-m}{1+m}$$

By adjusting the PMOS ratios at the CompZero node to the same size, a specified ASK modulation size can be demodulated.

The sensitivity now is only depending on the transistors mismatch, which is handled and documented very well in CMOS processes. No absolute influence on component parameters is given.

As a result this circuit allows realizing a controlled sensitivity.

Furthermore this circuit has a build in dynamic range, the sensitivity is always a function of the current ratio and not depending on the absolute current size.

A third advantage is the dynamic current consumption of the circuit. The current consumption is always a part of the limiters current.

At low field strength (means e.g. far distances), the current is small and when much current is available (e.g. at near distances), the circuits current consumption is also high.

The invention claimed is:

1. An Amplitude Shift Keying (ASK) demodulator for use in a Radio Frequency Identification (RFID) transponder, comprising
 a limiter circuit coupled to an antenna circuit and converting the ASK antenna field strength modulation into an ASK limiter current modulation by limiting the antenna voltage to a fixed value for generating a limiter current substantially proportional to the ASK antenna field strength, and
 a current discriminator circuit that discriminates the ASK limiter current modulation comprising:
 a first current mirror that mirrors the ASK limiter current or a copy of that current into a first pair of series-connected complementary MOS transistors;
 a second current mirror that mirrors the ASK limiter current or a copy of that current into a second pair of series-connected complementary MOS transistors;
 and a latch circuit with a set input coupled to the interconnection node of the first pair of complementary MOS transistors and a reset input coupled to the interconnection node of the second pair of complementary MOS transistors.

2. The ASK demodulator of claim 1, wherein both pairs of complementary MOS transistors have an NMOS ratio greater than the PMOS ratio and the relation NMOS ratio to PMOS ratio is greater in the first current mirror than in the second current mirror.

3. The ASK demodulator of claim 1, wherein the MOS transistors of like type in the first and second current mirrors receive a gate bias through a delay element.

4. The ASK demodulator of claim 3, wherein the delay element is an RC low pass filter.

5. The ASK demodulator of claim 2, wherein the MOS transistors of like type in the first and second current mirrors receive a gate bias through a delay element.

6. The ASK demodulator of claim 5, wherein the delay element is an RC low pass filter.

* * * * *